US012152316B1

(12) United States Patent
Chuang et al.

(10) Patent No.: US 12,152,316 B1
(45) Date of Patent: Nov. 26, 2024

(54) PASSIVATION OF NONLINEAR OPTICAL CRYSTALS

(71) Applicant: KLA Corporation, Milpitas, CA (US)

(72) Inventors: Yung-Ho Alex Chuang, Cupertino, CA (US); Vladimir Dribinski, Scotts Valley, CA (US)

(73) Assignee: KLA Corporation, Milpitas, CA (US)

( * ) Notice: Subject to any disclaimer, the term of this patent is extended or adjusted under 35 U.S.C. 154(b) by 267 days.

(21) Appl. No.: 17/532,685

(22) Filed: Nov. 22, 2021

Related U.S. Application Data

(62) Division of application No. 14/248,045, filed on Apr. 8, 2014, now Pat. No. 11,180,866.
(Continued)

(51) Int. Cl.
C30B 33/02 (2006.01)
C30B 7/00 (2006.01)
C30B 9/00 (2006.01)
C30B 29/10 (2006.01)
C30B 29/22 (2006.01)
G01N 21/95 (2006.01)
G01N 21/956 (2006.01)
G01N 21/84 (2006.01)
G01N 21/87 (2006.01)

(52) U.S. Cl.
CPC ............... C30B 33/02 (2013.01); C30B 7/00 (2013.01); C30B 9/00 (2013.01); C30B 29/10 (2013.01); C30B 29/22 (2013.01); G01N 21/9501 (2013.01); G01N 21/956 (2013.01); G01N 2021/8477 (2013.01); G01N 21/87 (2013.01); Y10T 117/1016 (2015.01); Y10T 117/1024 (2015.01)

(58) Field of Classification Search
CPC ......... C30B 33/02; C30B 29/10; C30B 29/22; C30B 9/00; C30B 7/00; G01N 21/9501; G01N 21/956; G01N 21/87; G01N 2021/8477; Y10T 117/1024; Y10T 117/1016
See application file for complete search history.

(56) References Cited

U.S. PATENT DOCUMENTS 5,861,609 A 1/1999 Kaltenbrunner et al.
5,998,313 A 12/1999 Sasaki et al.
(Continued)

FOREIGN PATENT DOCUMENTS

CN 1351679 A 5/2002
CN 102337586 A 2/2012
(Continued)

OTHER PUBLICATIONS

Machine translation of WO-2012029656-A1 (Year: 2012).*
(Continued)

Primary Examiner — Erin F Bergner
(74) Attorney, Agent, or Firm — Suiter Swantz IP

(57) ABSTRACT

The passivation of a nonlinear optical crystal for use in an inspection tool includes growing a nonlinear optical crystal in the presence of at least one of fluorine, a fluoride ion and a fluoride-containing compound, mechanically preparing the nonlinear optical crystal, performing an annealing process on the nonlinear optical crystal and exposing the nonlinear optical crystal to a hydrogen-containing or deuterium-containing passivating gas.

20 Claims, 6 Drawing Sheets

Related U.S. Application Data

(60) Provisional application No. 61/810,605, filed on Apr. 10, 2013.

(56) References Cited

U.S. PATENT DOCUMENTS

| | | | |
|---|---|---|---|
| 6,255,197 | B1 | 7/2001 | Fujimura et al. |
| 6,296,784 | B1 | 10/2001 | Sasaki et al. |
| 6,843,849 | B1 | 1/2005 | Sasaki et al. |
| 7,006,539 | B1 | 2/2006 | Sasaki et al. |
| 8,298,335 | B2 | 10/2012 | Armstrong |
| 8,873,596 | B2 | 10/2014 | Pribinski et al. |
| 9,250,178 | B2 | 2/2016 | Chuang et al. |
| 2003/0011872 | A1 | 1/2003 | Shull |
| 2003/0160177 | A1* | 8/2003 | Mayolet .............. C30B 11/00 250/372 |
| 2005/0109270 | A1* | 5/2005 | Brennan .............. C30B 29/12 117/83 |
| 2005/0286572 | A1 | 12/2005 | Li et al. |
| 2008/0286565 | A1 | 11/2008 | Koike et al. |
| 2013/0021602 | A1 | 1/2013 | Dribinski et al. |

FOREIGN PATENT DOCUMENTS

| | | | |
|---|---|---|---|
| JP | H09328395 | A | 12/1997 |
| JP | H10288800 | A | 10/1998 |
| JP | 2000147581 | A | 5/2000 |
| JP | 2000264787 | A | 9/2000 |
| JP | 2001296570 | A | 10/2001 |
| JP | 2008050240 | A | 3/2008 |
| JP | 2011529017 | A | 12/2011 |
| WO | WO-2012029656 A1 * | | 3/2012 ............. C30B 29/22 |
| WO | 2013043842 A1 | | 3/2013 |

OTHER PUBLICATIONS

First Japanese Office Action in Application No. 2019-176232 dated Oct. 27, 2020.
Office Action dated Jul. 21, 2020 for Chinese Patent Application No. 201910013932.2.
Office Action dated Mar. 6, 2018 for Japanese Patent Application No. 2016-507656.
Office Action issued May 28, 2019 for JP Patent Application No. 2016-507656.
Office Action received for Chinese Application No. 201910013932.2 issued on Jul. 21, 2020, 8 pages.

* cited by examiner

PASSIVATION OF NONLINEAR OPTICAL CRYSTALS

CROSS-REFERENCE TO RELATED APPLICATION

The present application is related to and claims the benefit of the earliest available effective filing dates from the following listed application: The present application constitutes a divisional patent application of U.S. patent application Ser. No. 14/248,045, filed on Apr. 8, 2014, which constitutes a regular (non-provisional) patent application of U.S. Provisional Patent Application, filed Apr. 10, 2013, Application Ser. No. 61/810,605, whereby both of the above-listed applications are incorporated by reference in their entirety.

TECHNICAL FIELD

The present invention relates to the field of nonlinear optical materials, and in particular to a system and method for passivating nonlinear optical crystals to cure crystal defects. The present invention further relates to deep ultraviolet (DUV) lasers and related inspection systems incorporating a nonlinear optical crystal.

BACKGROUND

Many modern-day laser systems require nonlinear optical (NLO) elements. Laser systems commonly utilize NLO crystals for many applications such as frequency mixing, Raman amplification, Kerr-lens mode-locking, electro-optic modulation, acousto-optic modulation and the like.

Laser-induced damage (LID) of NLO elements is a major limitation of many modern laser systems. LID occurs as a result of the interaction between laser radiation and the material making up a given NLO element. Exposure to electromagnetic radiation within a laser system may negatively impact various physical and optical properties of NLO crystals, such as, but not limited to, transmittance, reflectivity, and refraction. In turn, this degradation of physical properties due to accrued LID eventually leads to failure of NLO elements within the given laser system.

LID becomes even more problematic in laser systems that utilize shorter wavelengths of the electromagnetic spectrum, such as deep ultraviolet (DUV) light, with wavelengths less than 300 nm. In addition, NLO crystals are more susceptible to LID when they have a greater quantity or amount of crystal defects, such as, but not limited to, dislocations, impurities, vacancies, and the like. Accordingly, the presence of crystal defects in NLO crystals leads to increased levels of LID and, in turn, shorter crystal lifetimes.

As such, it would be desirable to provide a method and system that cure the defects of the prior art identified above.

SUMMARY

A method for passivating crystal defects of a nonlinear optical crystal is described, in accordance with an illustrative embodiment of the present invention. In one embodiment, the method may include growing a nonlinear optical crystal in the presence of at least one of fluorine, a fluoride ion and a fluoride-containing compound. In another embodiment, the method may include mechanically preparing (e.g., cutting and/or polishing) the nonlinear optical crystal. In another embodiment, the method may include performing an annealing process on the nonlinear optical crystal. In another embodiment, the method may include exposing the nonlinear optical crystal to a passivating gas, such as a hydrogen- or deuterium-containing passivating gas.

A system for passivating crystal defects of a nonlinear optical crystal is described, in accordance with an illustrative embodiment of the present invention. In one embodiment, the system may include a crystal grower configured to grow a borate-based nonlinear optical crystal in the presence of at least one of fluorine, a fluoride ion and a fluoride-containing compound. In another embodiment, a system may include a mechanical preparation stage configured to mechanically prepare the nonlinear optical crystal received from the crystal grower. In another embodiment, the system may include a passivating system. In another embodiment, the passivating system may include an exposure chamber configured to contain a passivating gas, the exposure chamber further configured to contain the nonlinear optical crystal for exposure to the passivating gas within the chamber. In another embodiment, the passivating system may include a passivating gas source fluidically coupled to the exposure chamber and configured to supply the passivating gas to an interior portion of the exposure chamber. In another embodiment, the passivating system may include an annealing stage disposed within the exposure chamber and configured to secure the nonlinear optical crystal within the exposure chamber, the stage including one or more thermal control elements configured to control the temperature of the nonlinear optical crystal.

A system for optically inspecting one or more samples is described, in accordance with an illustrative embodiment of the present invention. In one embodiment, the system may include a sample stage. In another embodiment, the system may include a laser system configured to illuminate a portion of the surface of one or more samples disposed on the sample stage. In another embodiment, the may include at least one passivated and annealed nonlinear optical crystal grown in the presence of fluorine or fluoride ions, the nonlinear optical crystal being sufficiently annealed to establish a water content below a selected level, the NLO crystal being sufficiently passivated to establish a selected passivation level. In another embodiment, the laser system may include at least one light source configured to generate light of a selected wavelength, the light source configured to transmit light through the nonlinear optical crystal. In another embodiment, the laser system may include a crystal housing unit configured to house the nonlinear optical crystal. In another embodiment, the laser system may include a detector configured to receive at least a portion of illumination reflected, scattered or emitted from the surface of the sample. In another embodiment, the system may include a computer controller communicatively coupled to the detector. In another embodiment, the computer controller is configured to acquire information regarding at least a portion of illumination received by the detector. In another embodiment, the computer controller is configured to determine the presence or absence of at least one defect of the sample utilizing information regarding at least a portion of illumination received by the detector.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Figure 1A:
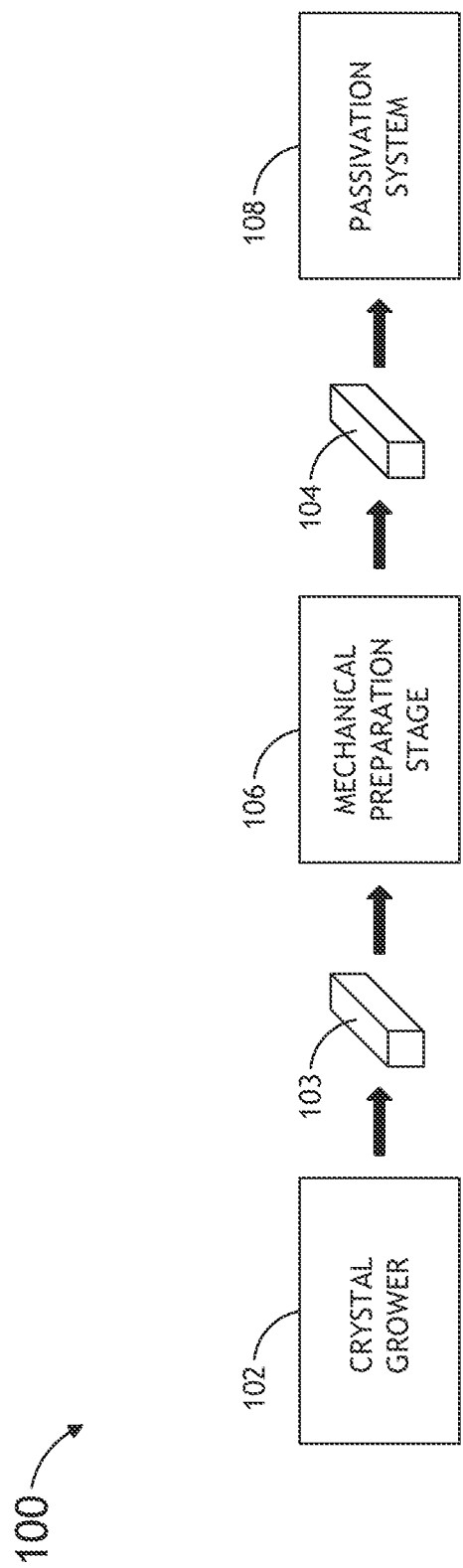
FIG. 1A is a block diagram illustrating a system for passivating a NLO crystal via fluorine-based doping and hydrogen-based doping, in accordance with one embodiment of the present invention.

Reference will now be made in detail to the subject matter disclosed, which is illustrated in the accompanying drawings.

Referring generally to FIGS. 1A through 4, a system and method for passivating a nonlinear optical (NLO) crystal is described in accordance with the present disclosure. Systems and methods for annealing and/or passivating nonlinear optical (NLO) crystals are described in U.S. patent application Ser. No. 13/488,635 to Chuang et al., filed on Jun. 1, 2012; and U.S. patent application Ser. No. 13/412,564 to Dribinski et al., filed on Mar. 5, 2012, which are both incorporated herein by reference in the entirety. It is noted herein that any of the methods and systems disclosed in the above applications may be used in combination with the methods and systems disclosed throughout the present disclosure.

Embodiments of the present invention are directed to the mitigation of the impact of laser-induced damage (LID) by reducing crystal defects in borate-based NLO crystals via annealing and/or hydrogen-based passivation of borate-based NLO crystals having undergone fluorine-doping. Embodiments of the present invention are directed to growing a borate-based crystal from a liquid (e.g., melt or solution) that includes a fluorine-based constituent. For the purposes of the present disclosure, "a fluorine-based constituent" may include fluorine, a fluorine ion or a fluorine-containing compound (e.g., lithium fluoride). The crystal growth process may include a stirring step when growing the borate-based crystal. It is recognized herein that fluoride ions contained within the liquid used to grow the borate-based crystal may reduce the viscosity of the liquid resulting in fewer defects occurring during crystal growth. It is further recognized herein that fluoride ions may attach at vacancies created by missing oxygen ions in the crystal lattice of the NLO crystal, thereby passivating the defect caused by the missing oxygen.

Embodiments of the present invention are further directed to annealing (or at least heating) the fluorine-doped NLO crystal at a selected temperature and further exposing the NLO crystal to a hydrogen-based passivating gas at a selected concentration. For the purposes of the present disclosure, a "hydrogen-based" gas may include any gas made up entirely or partially of hydrogen (e.g., H or $H_2$), a compound of hydrogen (e.g., $NH_3$ or $CH_4$), an isotope of hydrogen (e.g., deuterium) or a compound including an isotope of hydrogen. It is noted herein that the crystal defects may be cured through the attachment of hydrogen or deuterium atoms to dangling or broken bonds within the crystal. For example, the dangling or broken bonds may include dangling oxygen bonds, which are often a primary type of defect that affects physical/optical properties of the NLO crystal and, therefore, the lifetime of the NLO crystal. It is recognized herein that hydrogen or deuterium may be incorporated at crystal defects caused by missing alkali metal ions (e.g., lithium ions), thereby passivating a class of defects not passivated by the fluorine/fluorine ions. It is further recognized that the annealing process may serve to drive out, or reduce, water or OH content that was incorporated into the crystal during and/or subsequent to the crystal growth process. It is further noted herein that the resulting NLO crystal may have greater resistance to LID than a crystal that has been passivated only by hydrogen or only by fluorine.

As used throughout the present disclosure, the term "crystal", "NLO crystal", or "nonlinear crystal" generally refers to a nonlinear optical crystal suitable for frequency conversion. For example, the nonlinear optical crystal of the present invention may be configured to frequency convert incident illumination of a first wavelength (e.g., 532 nm) to an output illumination of a shorter wavelength (e.g., 266 nm). Further, the nonlinear optical crystal of the present invention may include, but is not limited to, beta-Barium Borate (BBO), Lithium Triborate (LBO), Lithium Tetraborate (LTB), Cesium Lithium Borate (CLBO), Cesium Borate (CBO), oxide-type non-linear crystals, and the like.

As used throughout the present disclosure, the term "wafer" generally refers to a substrate formed of a semiconductor or non-semiconductor material. For example, semiconductor or non-semiconductor materials include, but are not limited to, monocrystalline silicon, gallium arsenide, and indium phosphide. A wafer may include one or more layers. For example, such layers may include, but are not limited to, a resist, a dielectric material, a conductive material, and a semiconductive material. Many different types of such layers are known in the art, and the term wafer as used herein is intended to encompass a wafer on which all types of such layers may be formed.

Figure 1B:
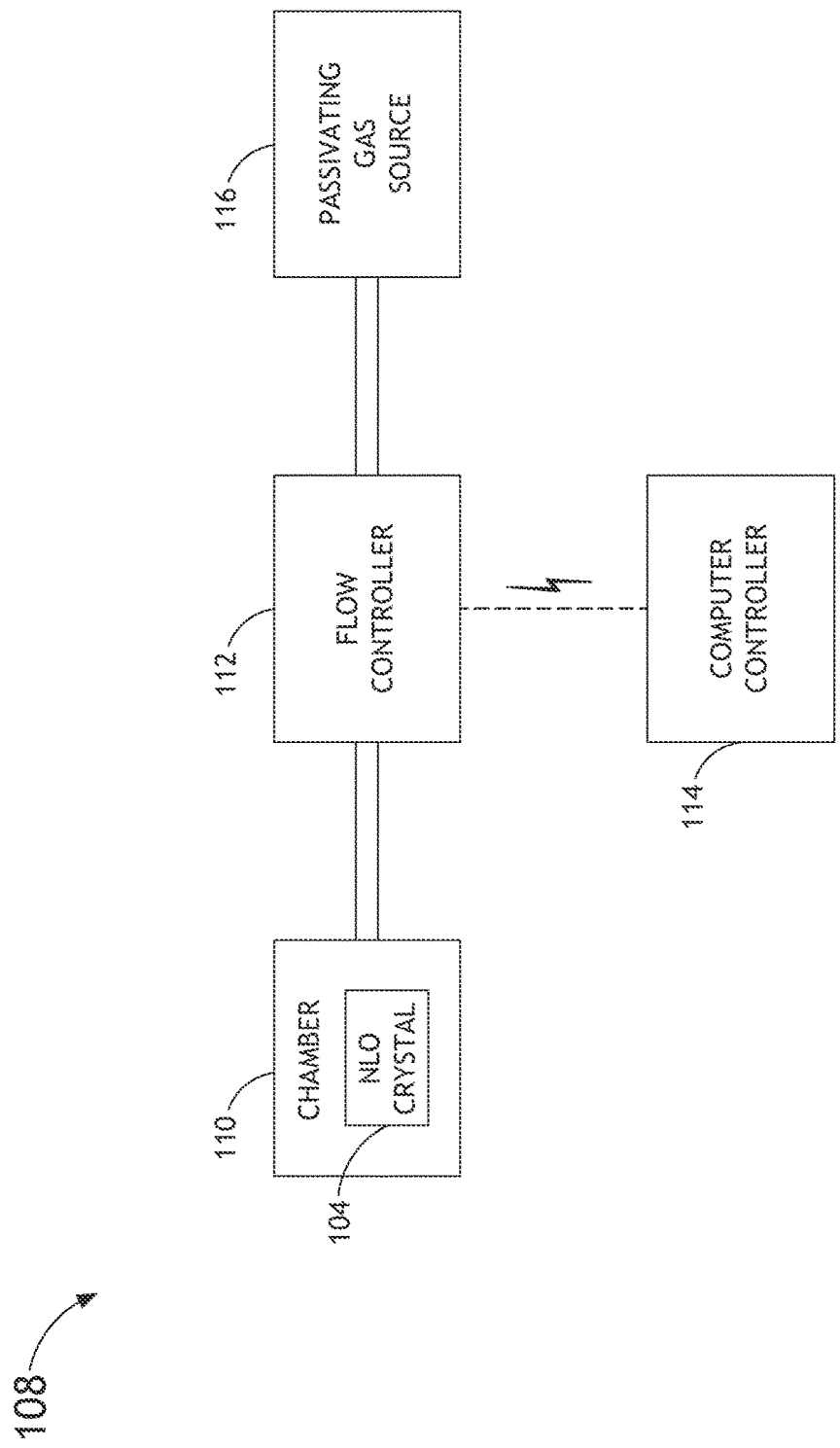
FIG. 1B is a block diagram illustrating a hydrogen-based passivation system, in accordance with one embodiment of the present invention.
Figure 1C:
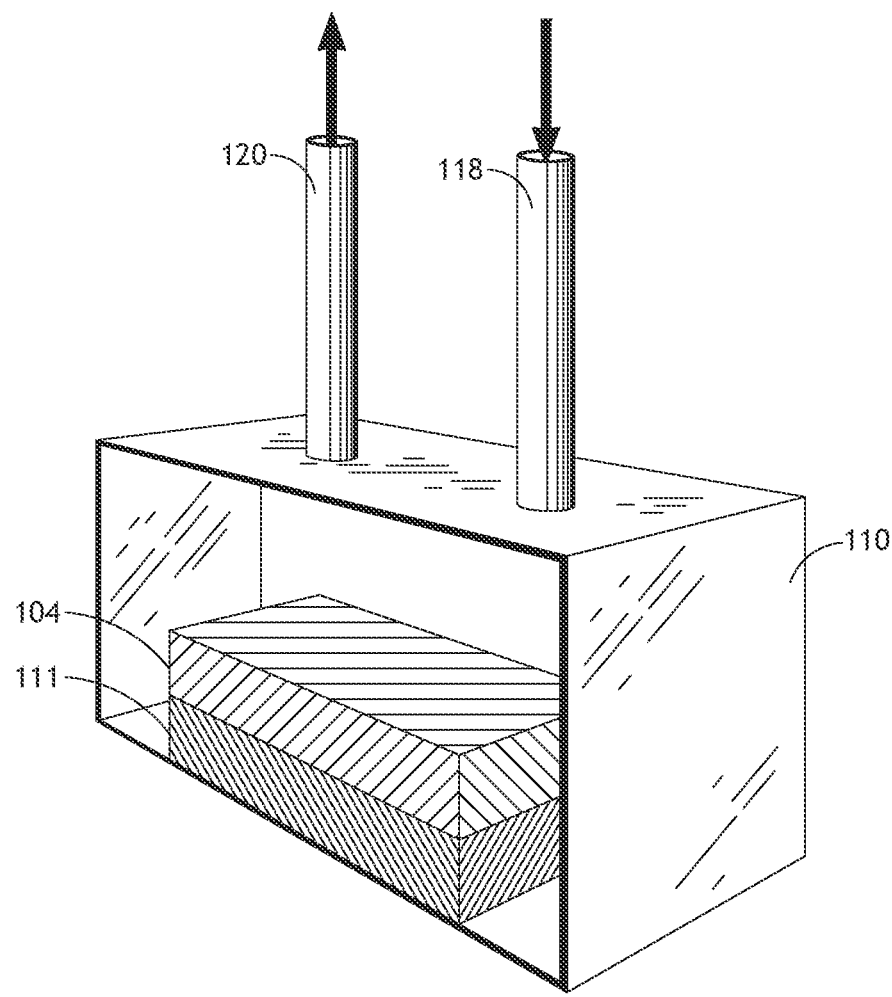
FIG. 1C illustrates a conceptual view of an exposure chamber of a system for passivating a NLO crystal, in accordance with one embodiment of the present invention.

FIGS. 1A-1C illustrate a system 100 for passivating an NLO crystal 104, in accordance with one embodiment of the present invention. It is recognized herein that the system 100 described herein and illustrated in FIGS. 1A-1C may be utilized to carry out one or more steps of the various methods described throughout the present disclosure. In one embodiment, the system 100 includes a crystal grower 102 for growing an NLO crystal 103, or crystal boule. In another embodiment, the system 100 includes a mechanical preparation stage 106 for performing one or more mechanical preparation steps on the NLO crystal 103 after crystal growth to obtain a cut and/or polished NLO crystal 104. In another embodiment, the system 100 includes a passivation system 108 configured to anneal the crystal 104 and/or passivate the crystal 104 with a passivating gas (e.g., hydrogen-based gas or hydrogen-based gas mixed with an inert gas).

In one embodiment, the crystal grower 102 is configured to grow a NLO crystal 103, or crystal boule, in the presence of one or more fluorine-based constituents, such as fluorine, a fluoride ion or a fluoride-containing compound (e.g., lithium fluoride). In another embodiment, the NLO crystal 103 grown by the crystal grower 102 includes a borate-based NLO crystal. In another embodiment, the borate-based NLO crystal may include, but is not limited to, Beta-Barium Borate (BBO), Lithium Triborate (LBO), Lithium Tetraborate (LTB), Cesium Lithium Borate (CLBO) and Cesium Borate (CBO) in the presence of at least one of fluorine, a fluoride ion and a fluoride-containing molecule.

In another embodiment, the crystal grower 102 is configured to grow a NLO crystal 103 from a liquid including one or more fluorine-based constituents (e.g., liquid including a fluorine-constituent concentration of 5-20% of the boron concentration). In one embodiment, the crystal grower 102 may grow the NLO crystal 103 from a melt containing one or more fluorine-constituents. In another embodiment, the crystal grower 102 may grow the NLO crystal 103 from a solution containing one or more fluorine-constituents. In another embodiment, the crystal grower 102 may include a stirring unit for carrying out a crystal stirring procedure on the liquid during the crystal growth process. The crystal grower 102 of system 100 may include any crystal grower or crystal growth system known in the art suitable for growing borate-based crystals. For example, borate-based crystal growth via crystal stirring is generally described in U.S. Pat. No. 6,843,849 to Sasaki et al., issued on Jan. 18, 2005, which is incorporated herein by reference in the entirety. It is further noted herein that the crystal growth process carried out by the present invention is described in greater detail further herein.

In another embodiment, the mechanical preparation stage 106 is configured to carry out one or more mechanical preparation steps on the crystal 104 following formation of the crystal 104 to achieve a desired shape, size and crystal orientation of the crystal 104. In one embodiment, the mechanical preparation stage 106 includes a crystal cutting unit. The crystal cutting unit of the mechanical preparation stage 106 may include any crystal cutting device or system known in the art suitable for cutting borate-based NLO crystals. In this regard, the crystal cutting unit may cut the crystal 103, or the crystal boule, received from the crystal grower 102 in order to achieve a crystal 104 having the desired shape, size and crystal orientation. In another embodiment, mechanical preparation stage 106 includes a crystal polisher. The crystal polisher may include any device or system suitable for polishing borate-based NLO crystals.

Referring now to FIG. 1B-1C, in one embodiment, the passivation system 108 configured to passivated and/or anneal the NLO crystal 104 includes an exposure chamber 110. In one embodiment, the exposure chamber 110 is configured to contain a volume of passivating gas. The exposure chamber 110 may be further configured to contain the NLO crystal 104 such that the NLO crystal 104 may be exposed to the passivating gas contained within the exposure chamber 110. In one embodiment, the exposure chamber 101 may be further configured to contain an annealing stage 102, or substrate, configured to secure the NLO crystal 104, while the NLO crystal 104 is exposed to passivating gas contained within the exposure chamber 110. In another embodiment, the annealing stage 102 may be a portion of an interior surface of the chamber 110.

In one embodiment, the passivating gas includes one or more of hydrogen, deuterium, a hydrogen-containing compound or a deuterium-containing compound. In one embodiment, the passivating gas includes a gaseous mixture of two or more gases having a selected concentration of a hydrogen-based component (e.g., hydrogen, deuterium, a hydrogen-containing compound or a deuterium-containing compound). In one embodiment, the gas mixture includes molecular hydrogen ($H_2$) or molecular deuterium ($D_2$). In another embodiment, the passivating gas includes a low-molecular-weight gas that may yield hydrogen or deuterium upon chemical reaction or dissociation. Such low-molecular-weight gases may include, but are not limited to, $NH_3$, $CH_4$ or deuterated versions of these and like molecules. The desired concentration of hydrogen or deuterium may include a concentration exceeding the natural abundance of hydrogen present under normal ambient conditions. In another embodiment, the desired concentration of hydrogen or deuterium may also be a user selected concentration or a concentration determined utilizing one or more physical attributes of the NLO crystal 104.

In another embodiment, the passivating gas mixture may further include an inert gas such as, but not limited to, argon, nitrogen, helium or the like. In another embodiment, the passivating gas of the present invention may include a gas mixture having a hydrogen-based component concentration (e.g., hydrogen, deuterium, a hydrogen-containing compound and a deuterium based compound) in the range of 5 to 10%. It is noted herein that this concentration range is not a limitation and is presented merely for purposes of illustration. It is contemplated that the hydrogen or deuterium concentration level of the passivating gas may include any range suitable for the given application. In another embodiment, the hydrogen-based component concentration of the passivating gas mixture may include a heavy isotope of hydrogen (e.g., deuterium) for improved passivation results. It is noted herein that the exact amount of deuterium in the mixture may be determined by optimizing, or at least improving passivation results above a selected level, and may vary from a fraction of the total hydrogen concentration to 100% of all the hydrogen in the mixture.

In another embodiment, the passivation system 108 includes a passivating gas source 116 fluidically coupled to the exposure chamber 110 and configured to supply the exposure chamber 110 with passivating gas. In another embodiment, as shown in FIG. 1C, the exposure chamber 110 may include a gas inflow port 118 configured to receive passivating gas from the passivating gas source 116 and further configured to transmit passivating gas received from the passivating gas source 116 to an interior portion of the exposure chamber 110. In another embodiment, as shown in FIG. 1C, the exposure chamber 110 may further include a gas outflow port 120 configured to release passivating gas from the interior portion of the exposure chamber 110.

In another embodiment, the passivating system 108 includes a flow controller 112 fluidically connected between the passivating gas source 116 and the exposure chamber 110. In another embodiment, the flow controller 112 may be configured to control the rate at which passivating gas is supplied to the exposure chamber 110. In another embodiment, the flow controller 112 may include a valve, regulator, or any other means for regulating the pressure or rate at which passivating gas moves through at least one conduit fluidically connecting the flow controller 112 to the exposure chamber 110. In another embodiment, the flow controller may be fluidically connected to the gas inflow port 118 of the exposure chamber and configured to control the rate at which passivating gas is supplied through the gas inflow port 118 to the interior portion of the exposure chamber 110. In another embodiment, the flow controller 112 or an additional flow controller (not shown) may be fluidically connected to the gas outflow port 120 of the exposure chamber 110 and configured to control the rate at which passivating gas is removed from the interior portion of the exposure chamber 110.

In another embodiment, the passivating system 108 includes one or more computer controllers 114 communicatively coupled to the flow controller 112. In one embodiment, the computer controller 114 provides the flow controller 112 with instructions for controlling the rate at which passivating gas is supplied to the exposure chamber 110. In another embodiment, the computer controller 114 provides the flow controller 112 or an additional flow controller (not shown) with instructions for controlling the rate at which passivating gas is removed from the exposure chamber 110. In another embodiment, the computer controller 114 includes a carrier medium (not shown), such as, but not limited to, a flash, solid-state, optical, random access or other static or dynamic memory device configured with program instructions. In one embodiment, the program instructions stored on the carrier medium may include a flow control algorithm. The flow control algorithm(s) utilized by controller 114 may include any flow control algorithm(s) known in the art, such as, but not limited to, one or more algorithms for configuring a pressure valve of the flow controller 112. In one embodiment, the flow control algorithm may direct the flow controller 112 to actuate one or more valves based on a correlation between one or more mechanical properties of the one or more valves and a desired flow rate. In one embodiment, a user selected flow rate of 10 to 200 $cm^3$/min may be a desirable flow rate for passivating the NLO crystal 104 contained within the exposure chamber 110. It is noted herein that the above flow rate is not limiting and flow rates outside of this range may be desirable based on the passivating gas mixture or the composition of the NLO crystal 104.

In another embodiment, the annealing stage 111 arranged to secure the NLO crystal 104 within the exposure chamber 110 includes one or more thermal control elements (not shown) configured to control the temperature of the NLO crystal 104. In one embodiment, the one or more thermal control elements include one or more heating elements (e.g., heaters). In another embodiment, the one or more thermal control elements include one or more cooling elements (e.g., Peltier cooler, cooling pipe(s) and the like).

In one embodiment, the one or more thermal control elements of the stage 111 carry out a thermal annealing process on the NLO crystal 104. In one embodiment, the one or more thermal control elements attain a selected temperature of the NLO crystal 104 below a melting temperature of the NLO crystal 104 and maintain the NLO crystal 104 at that selected temperature. In this regard, the one or more thermal control elements of the stage 111 may increase the temperature of the NLO crystal 104 to the selected temperature. In one embodiment, a user may select a temperature greater than ambient or room temperature, but less than the melting temperature of the NLO crystal 104. For example, the stage 111 may heat the NLO crystal 104 to a temperature in the range of 200-400° C. (e.g., 300-350° C.) or some other selected temperature and maintain that temperature for a selected time period (e.g., 1-200 hours). It is noted herein that the heating of the crystal 104 may improve hydrogen penetration into the crystal 104, alleviate decomposition of molecular hydrogen (e.g., $H_2$) or other hydrogen-containing molecule into atomic hydrogen, and/or eliminate undesirable reaction products between hydrogen and the NLO crystal (e.g., weak OH bonds, water, or the like).

In another embodiment, the one or more thermal control elements may carry out a multi-step annealing process. In one embodiment, the one or more thermal control elements of stage 111 may increase the temperature of the NLO crystal 104 to one or more intermediate temperatures (e.g., temperature in the range 100-150° C.). In one embodiment, the one or more thermal control elements of stage 111 may maintain the temperature of the NLO crystal 104 at the intermediate temperature for a selected time (e.g., 1-100 hours). In another embodiment, the one or more thermal control elements of stage 111 may increase the temperature of the NLO crystal 104 from the intermediate temperature to a selected temperature (e.g., temperature in the range 300-350° C.).

It is contemplated herein that the annealing stage 111 may be configured to increase, decrease, and/or maintain the temperature of the NLO crystal 104 at any feasible temperature or range of temperatures to passivate the NLO crystal 104 and/or drive out OH and/or water content of the NLO crystal 104. Accordingly, the foregoing temperature ranges are for illustration only and should not be interpreted as a limitation on the present invention.

Various systems for annealing and/or passivating NLO crystals are described in U.S. patent application Ser. No. 13/488,635 to Chuang et al., filed on Jun. 1, 2012; and U.S. patent application Ser. No. 13/412,564, filed on Mar. 5, 2012, which are both incorporated previously herein by reference in the entirety. It is again noted herein that any of the methods and systems disclosed in these applications may be used in combination with the methods and systems disclosed throughout the present disclosure.

Figure 2:
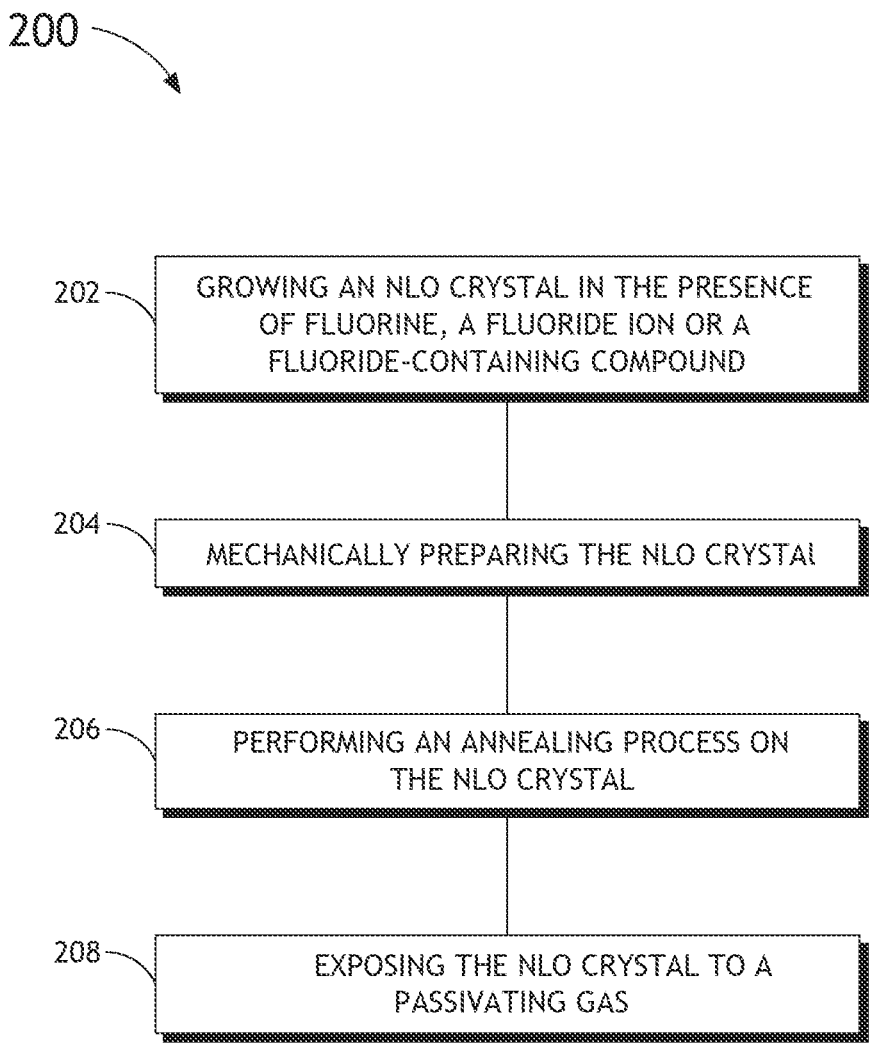
FIG. 2 is a flow diagram illustrating a method for passivating a NLO crystal, in accordance with one embodiment of the present invention.

FIG. 2 illustrates a process flow diagram depicting a method 200 for passivating the NLO crystal 104 with fluorine-based constituents and hydrogen-based gases in order to cure crystal defects caused by dangling or broken bonds and/or incorporation of water or OH groups into the crystal, in accordance with one embodiment of the present invention.

As shown in FIG. 2, the method 200 may include, but is not limited to, one or more of the following steps: (i) step 202, growing a nonlinear optical crystal in the presence of at least one of fluorine, a fluoride ion and a fluoride-containing compound; (ii) step 204, mechanically preparing the nonlinear optical crystal; (iii) step 206, performing an annealing process on the nonlinear optical crystal; and (iv) step 208, exposing the nonlinear optical crystal to a passivating gas. It is noted herein that while method 200 may be carried out utilizing system 100, the method 200 is not limited to the structural limitations of system 100 as it is recognized various other systems may carry out the steps of method 200.

In step 202, an NLO crystal 104 is grown in the presence of at least one of fluorine, a fluoride ion and a fluoride-containing compound. In one embodiment, an NLO crystal 103, or crystal boule, is grown from a liquid containing the selected NLO crystal material (e.g., borate-based material) and one or more of fluorine, a fluoride ion and a fluoride-containing compound (e.g., lithium fluoride). In one embodiment, an NLO crystal 103, or crystal boule, is grown from a melt or a solution containing the selected NLO crystal material and one or more of fluorine, a fluoride ion and a fluoride-containing compound. In one embodiment, the NLO crystal 103 is grown using a crystal stirring method. In one embodiment, the NLO crystal 104 grows in the presence of at least one of fluorine, a fluoride ion and a fluoride-containing compound is borate-based NLO crystal. For example, the borate-based NLO crystal may include, but is not limited to, Beta-Barium Borate (BBO), Lithium Triborate (LBO), Lithium Tetraborate (LTB), Cesium Lithium Borate (CLBO) or Cesium Borate (CBO). A system and method for growing a borate-based crystal is described in U.S. Pat. No. 6,843,849 to Sasaki et al., issued on Jan. 18, 2005, which is incorporated above by reference in the entirety.

In one embodiment, the atomic percentage of fluorine or fluoride in the liquid used to grow the NLO crystal is between approximately 5% and 20% of the atomic percentage of boron in the liquid. For example, the fluorine concentration in the liquid may be approximately 10% of the atomic concentration of boron in the liquid. In one embodiment, in the case of growing a CLBO crystal, the crystal may be grown from a melt formed from a mixture of $Cs_2CO_3$, $Li_2CO_3$, $B_2O_3$ and LiF with respective molecular ratios of approximately 1:0.749:5.5:0.502. It is noted herein that this mixture is boron deficient as is typically preferred for growing high quality CLBO crystals via the stirring method. In it further noted herein some embodiments of the present invention do not introduce a new cation with fluorine. In one embodiment, lithium fluoride (LiF) is utilized as the fluorine source for growing passivated CLBO, LBO or LTB crytals. In another embodiment, cesium fluoride (CsF) is utilized as the fluorine source for growing passivated CBO and CLBO crystals. In another embodiment, barium fluoride ($BaF_2$) is utililzed as the fluorine source for growing passivated BBO crystals. It is noted herein that the above compounds are not limitations on the present invention as additional fluorine sources may be utilized within the context of the present invention.

In step 204, the NLO crystal 103, or the crystal boule, formed via the growth step 202 is mechanically prepared. In one embodiment, the step of mechanically preparing the NLO crystal includes cutting the NLO crystal 103, or crystal boule, to form NLO crystal 104. In one embodiment, an NLO crystal 104 of the desired shape, size and/or orientation is cut from the NLO crystal boule produced in step 202. In another embodiment, the step of mechanically preparing the NLO crystal includes polishing the cut NLO crystal to form a polished NLO crystal 104.

In one embodiment, step of mechanically preparing the NLO crystal 103, or the crystal boule, is performed prior to annealing the crystal 104, described further herein. It is noted herein that the process of cutting and/or polishing the NLO crystal may expose the NLO crystal to moisture or humidity. It is further noted herein that by exposing the NLO crystal moisture or humidity after the annealing process the NLO crystal may absorb water, which may result in degraded performance of the NLO crystal. In one embodiment, an additional annealing step may be implemented to restore the NLO crystal properties.

In step 206, an annealing process on the NLO crystal 104 is performed. In one embodiment, the annealing process includes attaining a selected temperature of the NLO crystal below a melting temperature of the NLO crystal. For example, the annealing process may include increasing the temperature of the NLO crystal 104 to the selected temperature, such as a temperature in the range 200° to 400° C. (e.g., 300° to 350° C.), at a selected rate. In another embodiment, the annealing process may include maintaining the NLO crystal at the selected temperature for a selected time (e.g., 1 to 200 hours).

In another embodiment, the annealing process may include a stepped temperature ramping process. In one embodiment, the temperature of the NLO crystal is first increased to one or more intermediate temperatures (e.g., 100-200° C.). In another embodiment, the temperature of the NLO crystal 104 is maintained at the intermediate temperature for a selected time (e.g., 1-200 hours). In another embodiment, the temperature of the NLO crystal 104 is increased from the intermediate temperature to the selected temperature (e.g., 300-350° C.) and held at the selected temperature for a selected period of time (e.g., 1-200 hours). In another embodiment, all or part of the annealing process is carried out in an inert gas environment, such as, but not limited to, a He, $N_2$ or Ar environment.

For example, the NLO crystal 104 may be placed in a controlled environment, such as the annealing chamber 110 of system 100. In turn, the temperature of the NLO crystal 104 may be slowly raised to a selected annealing temperature at a rate of temperature change. For instance, the rate of temperature change may be chosen so as not to damage the crystal 104 by thermal stresses or the rapid drive-off of water. For example, in the case of a crystal having linear dimensions between about 10 mm and about 20 mm, a rate of temperature increase of approximately 1° C./min may be appropriate. It is recognized that a slower ramping rate may be utilized if the initial water or OH content is high. By way of another example, smaller crystals, or crystals with low water or OH content, may be ramped more quickly. In another embodiment, the crystal may be held for an extended time, such as a period of approximately 10 hours or until an FTIR absorption measurement shows low OH absorption, at a temperature between approximately 120° C. and approximately 150° C. so as to allow time for most of the water or OH to be driven off. In another embodiment, after holding the temperature at approximately 120° C. to 150° C. temperature (or any suitable temperature), the temperature may again be raised slowly (e.g., 0.5-2.0° C./min) until the selected temperature is reached.

In another embodiment, the NLO crystal 104 may be held for an extended time, such as a time of approximately 100 hours, at the selected temperature (e.g., 200-400° C.). For example, the selected temperature may be a temperature in the range of approximately 300 to 350° C. In one embodiment, the OH absorption may be monitored by, for example, FTIR until the OH concentration is below a selected threshold level. In another embodiment, a dry, inert gas, such as He, $N_2$ or Ar, is flowed through the exposure chamber in order to keep the NLO crystal 104 in a low humidity, low oxygen environment. In one embodiment, the flow rate may be in the range of approximately 10 to 200 $cm^3$/min.

The foregoing temperatures, time durations and temperature ramp rates are included by way of example only, and it is contemplated that these parameters may be significantly altered without departing from the essence of this disclosure. Accordingly, nothing herein should be construed to limit the present invention in any way.

In step 208, the NLO crystal 104 is exposed to a passivating gas. In one embodiment, the NLO crystal 104 is exposed to a passivating gas within an atmospherically controlled container such as the exposure chamber 110 of system 100. In one embodiment, the passivating gas may be a gas mixture having a selected concentration of at least one of hydrogen, deuterium, a hydrogen-containing compound and a deuterium-containing compound. In one embodiment, the selected hydrogen, deuterium, hydrogen-containing compound or deuterium-containing compound concentration may be a user selected concentration, a concentration determined utilizing one or more attributes of the NLO crystal 104, or any acceptable concentration for curing crystal defects of the NLO crystal 104. For example, the acceptable concentration may include any concentration suitable for curing crystal defects via the attachment of hydrogen or deuterium atoms from the passivating gas to broken or dangling bonds of the NLO crystal. In one embodiment, the selected hydrogen, deuterium, hydrogen-containing compound or deuterium-containing compound concentration of the passivating gas may include a concentration in the range of approximately 5 to 10% of the passivating gas mixture. It is noted herein that the foregoing concentration is not limiting and is provided merely for illustration. In another embodiment, the passivating gas may consist of a mixture of one or more inert gases, such as He, $N_2$ or Ar, and the selected concentration of hydrogen, deuterium, or a compound containing hydrogen or deuterium (e.g., a small molecule compound containing hydrogen or deuterium).

In a further step, the method 200 may further include a step of monitoring a degree of passivation of the NLO crystal 104. The degree of passivation may be correlated to an amount or change in amount of OH bonds of the NLO crystal 104 because the amount of OH bonds generally increase as the NLO crystal 104 is passivated as a result of having hydrogen atoms attach to dangling oxygen bonds of the NLO crystal 104. Accordingly, the degree of passivation may be monitored by analyzing one or more absorption bands of the NLO crystal 104, wherein the absorption band is affected by a change in the number of OH bonds of the NLO crystal 104. The absorption band may be analyzed by using any method known to the art for detecting a level at which the NLO crystal 104 absorbs illumination having one or more wavelengths. In one embodiment, the degree of passivation may be monitored utilizing Fourier Transform Infrared Spectroscopy (FTIR). For example, utilizing Fourier Transform Infrared Spectroscopy (FTIR), the degree of passivation of the NLO crystal 104 may be monitored through the observation of at least one absorption band in the Infrared (IR) spectrum of the NLO crystal 104. A FTIR process for monitoring the degree of passivation of the NLO crystal 104 may include one or more of the following steps: (i) transmitting illumination having one or more wavelengths through the NLO crystal 104; (ii) detecting illumination transmitted through the NLO crystal 104; and (iii) determining an amount of illumination absorbed by the NLO crystal 104 at one or more wavelengths utilizing information about illumination transmitted through the NLO crystal 104; and (iv) determining the degree of passivation of the NLO crystal 104 utilizing a correlation between illumination absorbed by the NLO crystal 104 at one or more wavelengths and the amount or change in amount of OH bonds of the NLO crystal 104.

In another embodiment, the NLO crystal 104 may be exposed to passivating gas in step 208 until the NLO crystal 104 is sufficiently passivated. In one embodiment, the step of monitoring the degree of passivation of the NLO crystal 104 may be utilized to determine whether or not the NLO crystal 104 has been sufficiently passivated. For example, the degree of passivation of the NLO crystal 104 may be determined by observing one or more absorption bands of the NLO crystal 104 appearing or changing intensity at one or more wavelengths of the IR spectrum in the range of approximately 3200 to 4000 $cm^{-1}$, wherein the amplitude or intensity of the absorption band appearing or changing intensity at the wavelength correlates to the amount or change in amount of OH bonds of the NLO crystal 104. For instance, FTIR may be used to monitor the absorption of —OH bonds (including $H_2O$) near 3580 $cm^{-1}$ in the infrared spectrum. For example, FTIR monitoring may be performed in-situ, wherein a crystal is monitored with FTIR while it is undergoing passivation. In another embodiment, the monitoring step may include the determination of whether or not the NLO crystal 104 has been sufficiently passivated by monitoring the relative change in the integrated peak intensity of one or more selected peaks in the FTIR absorption spectra. For instance, the monitoring step may include deeming the crystal 104 as sufficiently passivated when a 5% reduction in an —OH absorption peak is observed.

The foregoing range of absorption band wavelengths and the percentage change for sufficient passivation are included by way of example only and it is contemplated that one or more absorption bands may appear at other wavelengths in the IR, visible, and/or UV spectra; accordingly, the foregoing range of wavelengths is not intended to limit the present invention in any way.

In a further step, the temperature of the NLO crystal 104 may be decreased from the selected anneal temperature (e.g., 300-350° C.) to a lower temperature. In one embodiment, the temperature of the NLO crystal 104 may be decreased from the selected anneal temperature (e.g., 300-350° C.) to ambient temperature at a selected rate. For example, the selected rate of temperature decrease may be sufficiently low to avoid thermal stress large enough to damage the NLO crystal 104. For instance, the selected rate of temperature decrease may include reducing the temperature from 350° C. to 20° C. over the course of 2 to 10 hours.

It is again noted that various methods of annealing and/or passivating NLO crystals are described in U.S. patent application Ser. No. 13/488,635 to Chuang et al., filed on Jun. 1, 2012; and U.S. patent application Ser. No. 13/412,564, filed on Mar. 5, 2012, which are both incorporated previously herein by reference in the entirety.

The foregoing steps are neither sequential nor mandatory and may occur in any order or concurrent with one another. For example, it is contemplated that in one embodiment of the method 200, the NLO crystal 104 may be exposed to passivating gas as provided for in step 208; and concurrently, the degree of passivation of the NLO crystal 104 may be monitored utilizing FTIR. In some instances it may be advantageous to combine some or all of the steps and to arrange the steps in a sequence that departs from the order in which the steps have been discussed herein. The discussion herein is explanatory only and is not intended to limit the method or methods disclosed herein to any particular sequence, order, or combination of steps It is noted herein that it may be advantageous to incorporate the NLO crystal 104, having been sufficiently annealed and passivated, into a laser system for improved physical/optical performance, such as, but not limited to, improved stability, or greater crystal lifetime than that achieved utilizing a conventional NLO crystal. The laser system configuration of the present disclosure may include, but is not limited to, configurations such as CW, mode-locked, quasi-CW, Q-switched, and any other laser or laser system including one or more nonlinear crystals. The description herein is further intended to include a broad range of possible laser spectra, including but not limited to electromagnetic spectra such as Vacuum Ultraviolet (VUV), Deep Ultraviolet (DUV), Ultraviolet (UV), Infrared, visible, and the like. As used herein, the terms "laser system" and "laser" may be used interchangeably to describe a configuration of one or more lasers.

Figure 3:
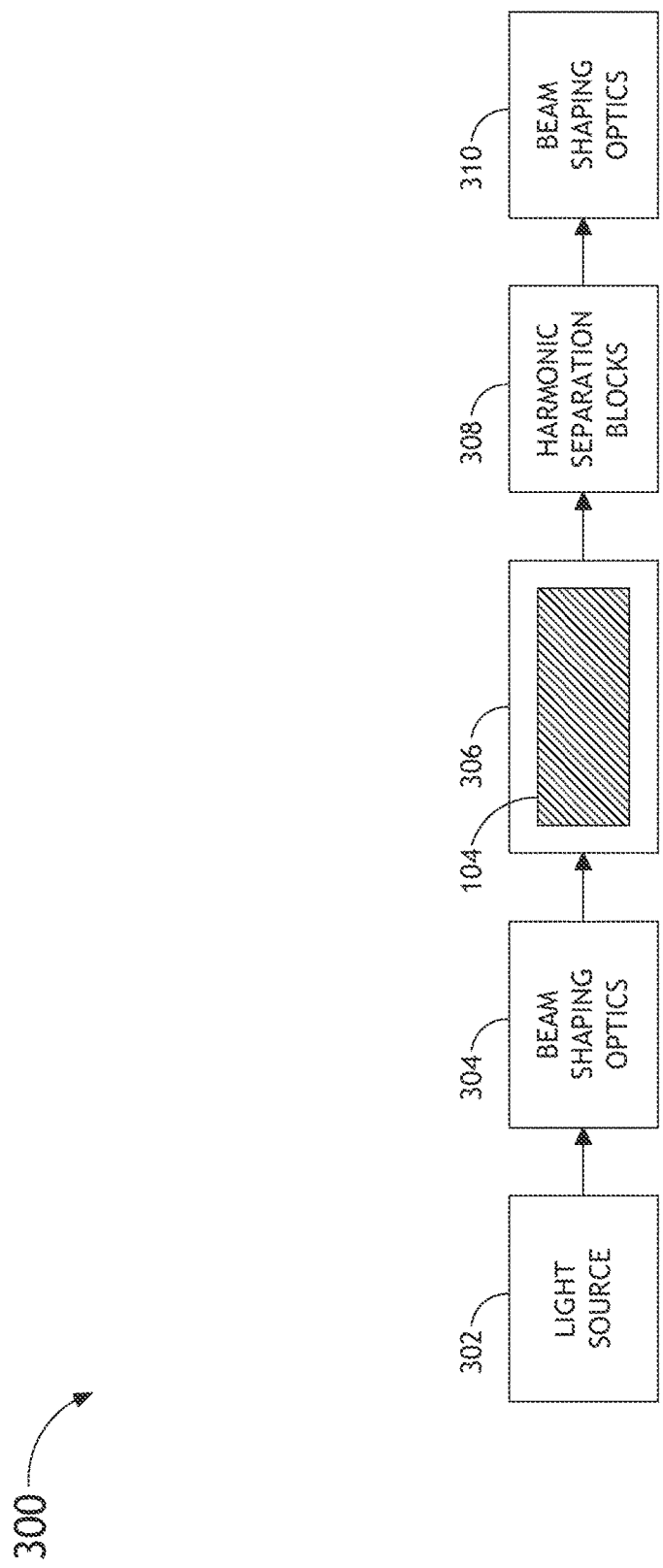
FIG. 3 is a block diagram illustrating a laser system equipped with an annealed and passivated NLO crystal grown in the presence of fluorine or a fluorine ion, in accordance with one embodiment of the present invention.

FIG. 3 illustrates a laser system 300 equipped with a passivated and/or annealed NLO crystal 104, in accordance with one embodiment of the present invention. In one embodiment, the laser system 300 includes, but is not limited to, a light source 302, a first set of beam shaping optics 304, the passivated/annealed crystal 104 as described previously herein, a housing unit 306, a set of harmonic separation elements 308, and a second set of beam shaping optics 310.

In one embodiment, the output of a light source 302 may be focused to an elliptical cross-section Gaussian beam waist in or proximate to a passivated/annealed NLO crystal 104 using beam shaping optics 304. As used herein, the term "proximate to" is preferably less than half of the Rayleigh range from the center of crystal 104. In one embodiment, the aspect ratio between the Gaussian widths of the principle axes of the ellipse may fall between about 2:1 and about 6:1. In another embodiment, the ratio between the principle axes of the ellipse may be between about 2:1 and about 10:1. In one embodiment, the wider Gaussian width is substantially aligned with the walk-off direction of the NLO crystal 104 (e.g. to within about 10° of alignment).

In another embodiment, the housing unit 306 may protect the NLO crystal 104 from ambient atmospheric conditions and other impurities, thereby facilitating maintenance of its passivated/annealed condition. Note that a crystal exposed to atmospheric water and other impurities over time will begin to deteriorate and may revert back to an unpassivated or un-annealed state. Crystal housing units are described generally in U.S. patent application Ser. No. 12/154,337 to Armstrong, filed May 6, 2008, which is incorporated herein by reference in the entirety. In one embodiment, housing unit 306 may include a large structure suitable for housing crystal 104 and other components of the laser system 300. In other embodiments, housing 306 may be large enough to house all components of the laser system 300. It is noted herein that the larger the housing, the more precautions that are needed for maintenance and repair of the laser system (to protect crystal 104 from degradation and maintain its passivated/annealed condition). As such, in another embodiment, the housing unit 306 may consist of a small housing structure suitable for enclosing primarily only the NLO crystal 104.

In another embodiment, beam shaping optics 304 may include anamorphic optics, which may change the cross section of output from light source 302. In one embodiment, anamorphic optics may include, but are not limited to, at least one of a prism, a cylindrical curvature element, a radially-symmetric curvature element, and a diffractive element. In one embodiment, light source 302 may include a laser producing light having a frequency in the visible range (e.g. 532 nm) to be doubled inside crystal 104. In another embodiment, light source 302 may include a laser source producing two or more frequencies to be combined inside crystal 104 to generate a sum or difference frequency. Frequency conversion and associated optics and hardware are described in U.S. patent application Ser. No. 13/412,564 to Dribinski et al., filed on Mar. 6, 2012, which is incorporated previously herein by reference in the entirety.

Figure 4:
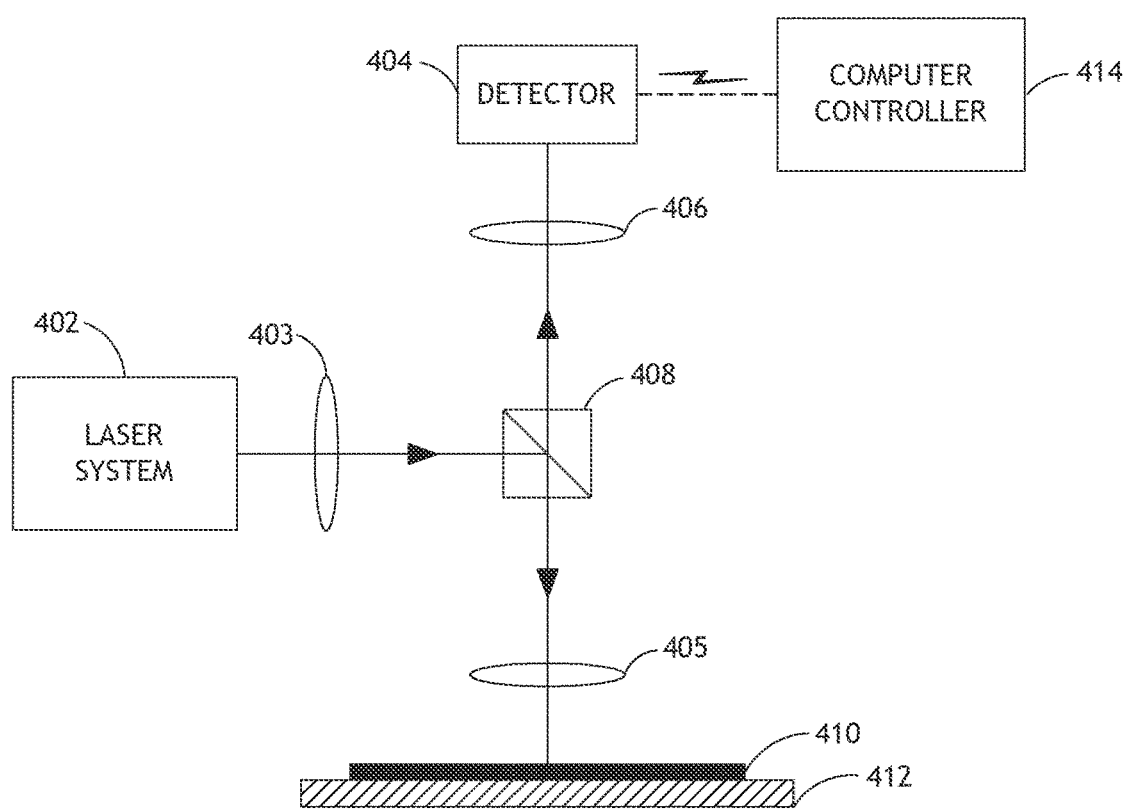
FIG. 4 is a block diagram illustrating a system for inspecting a wafer or a photomask, in accordance with one embodiment of the present invention.

FIG. 4 illustrates an inspection system 400 configured to measure or analyze defects of one or more samples 410, such as a photomask (i.e., a reticle), wafer, or any other sample that may be analyzed utilizing an optical inspection system. The inspection system 400 may include a laser system 402 that incorporates the laser system 300 as described previously herein. The laser system 402 may include one or more of the passivated/annealed NLO crystals 104 described throughout the present disclosure. In one embodiment, the NLO crystal 104 of the laser system 402 may be sufficiently annealed to reduce the water content of the NLO crystal 104 to a selected water content level, and may further comprise fluorine and/or hydrogen doping, as described throughout the present disclosure.

In another embodiment, the NLO crystal 104 of the laser system 402 may be sufficiently passivated to cure crystal defects caused by dangling or broken bonds, such as dangling oxygen bonds. Dangling or broken bonds of the NLO crystal 104 may be cured through passivation by bonding hydrogen atoms to the broken or dangling bonds of the NLO crystal 104. In some cases, a portion of dangling or broken bonds may be products of the annealing process performed on the NLO crystal 104. The NLO crystal 104 may be passivated to a selected degree of passivation that is acceptable for achieving desired physical/optical performance, improved LID resistance, improved output beam quality, improved output stability, increased crystal lifetime, or higher operating power.

In one embodiment, the NLO crystal 104 of the laser system 402 may have at least one absorption band in the IR spectrum of the NLO crystal 104, which may be correlated to the presence, absence, or amount of OH bonds of the NLO crystal 104. In another embodiment, the absorption band of the NLO crystal 104 may be measured utilizing FTIR to determine the degree of passivation or the water content level of the NLO crystal 104. In another embodiment, a specified amplitude or intensity of the absorption band of the NLO crystal 104 may correspond to a sufficient annealing level or a sufficient passivating level of the NLO crystal 104. In another embodiment, the specified amplitude or intensity of the absorption band may be a user selected value, or a value determined utilizing one or more attributes of the NLO crystal 104. Accordingly, the absorption band of NLO crystal 104 of the laser system 402 may have an amplitude or intensity at or near the specified amplitude or intensity. In another embodiment, the laser system 402 may further include at least one electromagnetic source, such as a diode pumped solid state (DPSS) source or a fiber IR source, configured to provide illumination to the NLO crystal 104. In one embodiment, at least a portion of the illumination provided by the electromagnetic source may be directly or indirectly transmitted through the NLO crystal 104 in a frequency conversion process of the crystal 104.

The inspection system 400 may further include a sample stage 412 configured to hold the sample 410 during the inspection process. The sample stage 412 may be configured to hold the sample 410 in a location where the sample 410 may receive at least a portion of illumination transmitted from the laser system 402. The sample stage 412 may be further configured to actuate the sample 410 to a user selected location. The sample stage 412 may further be communicatively coupled to one or more computing systems and configured to actuate the sample 410 to the user selected location or to a location determined by the computing system, wherein the sample 410 may receive at least a portion of illumination transmitted from the laser system 402.

In another embodiment, the inspection system 400 may include a detector 404 configured to directly or indirectly receive at least a portion of illumination reflected from a surface of the sample 410. The detector 404 may include any suitable detector known to the art, such as a charged coupled device (CCD) or a time-delay-and-integration (TDI) CCD based detector. The inspection system 400 may further include one or more computer controllers 414 communicatively coupled to the detector 404. The computer controller 414 may be configured to receive information regarding characteristics of illumination reflected from the surface of the sample 410 from the detector 404. In another embodiment, the computer controller 414 may be configured to execute an inspection algorithm from program instructions stored on a carrier medium of the computer controller 414. The inspection algorithm may include any inspection algorithm known in the art for measuring one or more defects of the sample 410 utilizing information regarding characteristics of illumination reflected from the surface of the sample 410. Accordingly, the computer controller 414 may utilize information regarding illumination reflected from the surface of the sample 410 to make measurements, such as presence, absence, quantity, and/or type of defects of the sample 410.

The inspection system 400 may include one or more illumination optical elements 403 (e.g. retarders, quarter wave plates, focus optics, phase modulators, polarizers, mirrors, beam splitters, reflectors, converging/diverging lenses, prisms, etc.). The illumination optical elements 403 may be configured to directly or indirectly receive illumination emanating from the laser system 402. The illumination optical elements 403 may be further configured to transmit and/or direct at least a portion of illumination directly or indirectly received from the laser system 402 along an illumination path of the inspection system 400 to the surface of the sample 410. The illumination path may consist of any path along which illumination can travel from the laser system 402 to the surface of the sample 410, such as a direct line of sight between the laser system 402 and the surface of the sample 410. In another embodiment, the illumination path may be defined by a configuration of one or more optical elements including, but not limited to, the illumination optical elements or any other optical elements disclosed herein.

In one embodiment, the illumination path of the inspection system 400 may include a beam splitter 408 configured to transmit at least a portion of illumination received directly or indirectly from the laser system 402 to the surface of the sample 410 or to a further component of the illumination path. In another embodiment, the beam splitter 408 include any optical device capable of splitting a beam of illumination into two or more beams of illumination. In another embodiment, the illumination path may further include inspection optical elements 405 (e.g. retarders, quarter wave plates, focus optics, phase modulators, polarizers, mirrors, beam splitters, reflectors, converging/diverging lenses, prisms, etc.) configured to transmit at least a portion of illumination received directly or indirectly from the laser system 402 to the surface of the sample 410.

In one embodiment the inspection system 400 may include collection optical elements 405 (e.g. retarders, quarter wave plates, focus optics, phase modulators, polarizers, mirrors, beam splitters, reflectors, converging/diverging lenses, prisms, etc.) configured to directly or indirectly receive at least a portion of illumination reflected from the surface of the sample 410. The collection optical elements 406 may be further configured to transmit at least a portion of illumination directly or indirectly received from the surface of the sample 410 along a collection path of the inspection system 400 to the detector 404. The collection path may include any path along which illumination can travel from the surface of the sample 410 to the detector 404, such as a direct line of sight between the surface of the sample 410 and the detector 404. In another embodiment, the collection path may include a path defined by a configuration of one or more optical elements including, but not limited to, the collection optical elements or any other optical elements disclosed herein.

In one embodiment, the inspection system 400 is configured as a bright-field inspection system. In another embodiment, the inspection system 400 is configured as a dark-field inspection system.

While the present disclosure describes the inspection system 400 in the context of inspecting one or more samples, it is contemplated herein that the inventive aspects of the inspection system 400 may be extended to a wide array of inspection or optical metrology systems. For example, the inspection system 400 may be configured as a bright-field inspection system, a dark-field inspection system, or any other mode of inspection or configuration now or hereafter known in the art. For example, the inspection system 400 may be configured to carry out inspection of one or more photomasks, patterned wafers, unpatterned wafers, or any other inspection capability now or hereafter known to the art.

It should be recognized that the various control steps described throughout the present disclosure may be carried out by a single computing system or, alternatively, a multiple computing system. Moreover, different subsystems of the system may include a computing system suitable for carrying out at least a portion of the steps described above. Therefore, the above description should not be interpreted as a limitation on the present invention but merely an illustration. Further, the one or more computing systems may be configured to perform any other step(s) of any of the method embodiments described herein. The computer controller(s) may include, but is not limited to, a personal computing system, mainframe computing system, workstation, image computer, parallel processor, or any other device known in the art. In general, the term "computing system" may be broadly defined to encompass any device having one or more processors, which execute instructions from a memory medium. Program instructions implementing methods such as those described herein may be transmitted over or stored on carrier medium. The carrier medium may be a transmission medium such as a wire, cable, or wireless transmission link. The carrier medium may also include a storage medium such as a read-only memory, a random access memory, a magnetic or optical disk, or a magnetic tape.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

It is further contemplated that each of the embodiments of the method described above may include any other step(s) of any other method(s) described herein. In addition, each of the embodiments of the method described above may be performed by any of the systems described herein.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A method comprising:
   growing a fluorine-doped borate-based nonlinear optical crystal from a melt containing an atomic percent of fluorine of 5-20% of the atomic percentage of boron in the melt to inhibit incorporation of OH into the fluorine-doped borate-based nonlinear optical crystal, wherein the fluorine-doped borate-based nonlinear optical crystal comprises at least one of cesium borate (CBO) or cesium lithium borate (CLBO);
   mechanically preparing the fluorine-doped borate-based nonlinear optical crystal;
   performing an annealing process on the fluorine-doped borate-based nonlinear optical crystal to heat the fluorine-doped borate-based nonlinear optical crystal to drive OH content out of the fluorine-doped borate-based nonlinear optical crystal; and
   exposing the fluorine-doped borate-based nonlinear optical crystal to a passivating gas comprising at least one of deuterium mixed with one or more inert gases or a deuterium-containing compound mixed with one or more inert gases, wherein the at least one of deuterium or the deuterium-containing compound of the passivating gas has a selected concentration in a range of 5 to 10%.

2. The method of claim 1, wherein the growing a fluorine-doped borate-based nonlinear optical crystal from a melt comprises:
   growing a nonlinear optical crystal including one or more borate-based compounds in the presence of at least one of fluorine, a fluoride ion and a fluoride-containing molecule.

3. The method of claim 1, wherein the growing a fluorine-doped borate-based nonlinear optical crystal from a melt comprises:
   growing a nonlinear optical crystal in a melt including at least one of fluorine, a fluoride ion and fluoride-containing compound.

4. The method of claim 1, wherein the growing a fluorine-doped borate-based nonlinear optical crystal from a melt comprises:
   growing a fluorine-doped borate-based nonlinear optical crystal from a melt and a solution including at least one of fluorine, a fluoride ion and fluoride-containing compound.

5. The method of claim 1, wherein the growing a fluorine-doped borate-based nonlinear optical crystal from a melt comprises:
   growing a fluorine-doped borate-based nonlinear optical crystal from a melt a liquid including lithium fluoride.

6. The method of claim 3, wherein the growing a fluorine-doped borate-based nonlinear optical crystal from a melt comprises:
   stirring the melt.

7. The method of claim 1, wherein the mechanically preparing the fluorine-doped borate-based nonlinear optical crystal comprises:
   cutting the fluorine-doped borate-based nonlinear crystal to achieve at least one of a selected shape, a selected size and selected crystal orientation.

8. The method of claim 1, wherein the mechanically preparing the fluorine-doped borate-based nonlinear optical crystal comprises:
   polishing the fluorine-doped borate-based nonlinear optical crystal.

9. The method of claim 1, wherein the performing an annealing process on the fluorine-doped borate-based nonlinear optical crystal comprises:
   attaining a selected temperature of the fluorine-doped borate-based nonlinear optical crystal below a melting temperature of the fluorine-doped borate-based nonlinear optical crystal; and
   maintaining the fluorine-doped borate-based nonlinear optical crystal at the selected temperature.

10. The method of claim 9, wherein the attaining a selected temperature of the fluorine-doped borate-based nonlinear optical crystal below a melting temperature of the fluorine-doped borate-based nonlinear optical crystal comprises:
    increasing the temperature of the fluorine-doped borate-based nonlinear optical crystal to the selected temperature.

11. The method of claim 9, wherein the attaining a selected temperature of the fluorine-doped borate-based nonlinear optical crystal below a melting temperature of the fluorine-doped borate-based nonlinear optical crystal comprises:
increasing the temperature of the fluorine-doped borate-based nonlinear optical crystal to one or more intermediate temperatures;
maintaining the fluorine-doped borate-based nonlinear optical crystal at the one or more intermediate temperatures for one or more selected time periods; and
increasing the temperature of the fluorine-doped borate-based nonlinear optical crystal to the selected temperature.

12. The method of claim 9, wherein the selected temperature is in the range of approximately 200 to 400° C.

13. The method of claim 1, wherein the performing an annealing process on the fluorine-doped borate-based nonlinear optical crystal comprises:
performing an annealing process on the fluorine-doped borate-based nonlinear optical crystal in the presence of one or more inert gases.

14. The method of claim 1, further comprising:
decreasing the fluorine-doped borate-based nonlinear optical crystal from an anneal temperature to ambient temperature at a selected rate.

15. The method of claim 1, further comprising:
monitoring a degree of passivation of the fluorine-doped borate-based nonlinear optical crystal via one or more selected absorption bands.

16. The method of claim 15, wherein the monitoring a degree of passivation of the fluorine-doped borate-based nonlinear optical crystal via one or more selected absorption bands comprises:
monitoring a degree of passivation of the fluorine-doped borate-based nonlinear optical crystal via one or more selected absorption bands in at least one of an infrared spectral range, a visible spectral range, and an ultraviolet spectral range.

17. The method of claim 15, wherein the monitoring a degree of passivation of the fluorine-doped borate-based nonlinear optical crystal via one or more selected absorption bands comprises:
monitoring a degree of passivation of the fluorine-doped borate-based nonlinear optical crystal by measuring one or more characteristics of the one or more selected absorption bands indicative of an abundance of OH bonds in the fluorine-doped borate-based nonlinear optical crystal.

18. The method of claim 1, further comprising:
monitoring water content of the fluorine-doped borate-based nonlinear optical crystal via one or more selected absorption bands.

19. The method of claim 18, wherein the monitoring water content of the fluorine-doped borate-based nonlinear optical crystal via one or more selected absorption bands comprises:
monitoring water content of the fluorine-doped borate-based nonlinear optical crystal via one or more selected absorption bands in at least one of an infrared spectral range, a visible spectral range, and an ultraviolet spectral range.

20. The method of claim 18, wherein the monitoring water content of the fluorine-doped borate-based nonlinear optical crystal via one or more selected absorption bands comprises:
monitoring water content of the fluorine-doped borate-based nonlinear optical crystal by measuring one or more characteristics of the one or more selected absorption bands indicative of an abundance of OH bonds in the fluorine-doped borate-based nonlinear optical crystal.

* * * * *